(12) United States Patent
Sakano

(10) Patent No.: US 6,986,115 B2
(45) Date of Patent: Jan. 10, 2006

(54) DELAY TIME CALCULATION APPARATUS AND INTEGRATED CIRCUIT DESIGN APPARATUS

(75) Inventor: Miho Sakano, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 249 days.

(21) Appl. No.: 10/383,522

(22) Filed: Mar. 10, 2003

(65) Prior Publication Data

US 2004/0060021 A1 Mar. 25, 2004

(30) Foreign Application Priority Data

Sep. 20, 2002 (JP) .................................. 2002-275543

(51) Int. Cl.
*G06F 17/50* (2006.01)

(52) U.S. Cl. ............................................. 716/5; 716/6
(58) Field of Classification Search ............... 716/1–14; 703/13–14, 19
See application file for complete search history.

(56) References Cited

U.S. PATENT DOCUMENTS

| | | | | |
|---|---|---|---|---|
| 4,924,430 A | * | 5/1990 | Zasio et al. ..................... | 716/6 |
| 6,018,623 A | * | 1/2000 | Chang et al. ................... | 716/6 |
| 6,072,948 A | * | 6/2000 | Saitoh et al. .................. | 703/14 |
| 6,523,158 B1 | * | 2/2003 | Hidaka .......................... | 716/10 |
| 6,543,041 B1 | * | 4/2003 | Scheffer et al. ............... | 716/10 |
| 6,594,805 B1 | * | 7/2003 | Tetelbaum et al. ............. | 716/5 |
| 6,701,496 B1 | * | 3/2004 | Fischer .......................... | 716/6 |
| 2003/0115563 A1 | * | 6/2003 | Chen ............................. | 716/5 |

FOREIGN PATENT DOCUMENTS

| | | |
|---|---|---|
| JP | 2001-265826 | 9/2001 |
| JP | 2001-306647 | 11/2001 |

* cited by examiner

*Primary Examiner*—Leigh M. Garbowski
(74) *Attorney, Agent, or Firm*—Buchanan Ingersoll PC; Burns Doane Swecker & Mathis

(57) ABSTRACT

A delay time calculation apparatus includes a resistance-capacitance determining section for determining a source resistance and a diffusion capacitance of a target gate of a delay time calculation before a process variation, and a wiring resistance and a wiring capacitance of a wire connected to the gate after the process variation. The delay time of the gate is calculated according to the results the resistance-capacitance determining section obtains. It can solve a problem of a conventional apparatus in that although the conventional apparatus can calculate the delay time of the gate accurately as long as the process variation coefficients for the cell delay and wire delay match the target gate of the delay time calculation, it becomes increasingly difficult to calculate the delay time accurately with an increase in the error of the process variation coefficients.

6 Claims, 10 Drawing Sheets

Gate_delay(max) = Cell_delay(typ)' × KPcell(max) + Wire_delay(max)(× KTWire(max))

Gate_delay(min) = Cell_delay(typ)" × KPcell(min) + Wire_delay(min)(× KTWire(min))

Gate_delay(max) = Cell_delay(typ)' × KPcell(max) + Wire_delay(max)

Gate_delay(min) = Cell_delay(typ)" × KPcell(min) + Wire_delay(min)

Gate_delay(max) = Cell_delay(max) + Wire_delay(max)

Gate_delay(min) = Cell_delay(min) + Wire_delay(min)

Gate_delay(typ) = Cell_delay(typ) + Wire_delay(typ)

Gate_delay(max) = Cell_delay(typ) × KPcell(max) + Wire_delay(typ) × KPwire(max)

Gate_delay(min) = Cell_delay(typ) × KPcell(min) + Wire_delay(typ) × KPwire(min)

C(typ), R(typ)

DELAY TIME CALCULATION APPARATUS AND INTEGRATED CIRCUIT DESIGN APPARATUS

BACKGROUND OF THE INVENTION

1. Field of the Invention

The present invention relates to a delay time calculation apparatus for calculating the delay time of a gate after a process variation and to an integrated circuit design apparatus using the same.

2. Description of Related Art

A semiconductor integrated circuit is composed of a plurality of gates. A delay time of each gate (called "gate_delay" from now on) is defined as a sum of a delay time occurring within the gate (called "cell_delay" from now on) and a delay time (called "wire_delay" from now on) occurring in wire connected to the gate.

FIG. 10 is a schematic diagram illustrating a gate delay gate_delay(typ) in a typical condition, in which the delay time is typical (see, expression (1)); FIG. 11 is a schematic diagram illustrating a gate delay gate_delay(max) in a maximum condition, in which the cell delay is maximum (see, expression (2)); and FIG. 12 is a schematic diagram illustrating a gate delay gate_delay(min) in a minimum condition, in which the cell delay is minimum (see, expression (3)).

$$\text{gate\_delay(typ)} = \text{cell\_delay(typ)} + \text{wire\_delay(typ)} \quad (1)$$

$$\text{gate\_delay(max)} = \text{cell\_delay(max)} + \text{wire\_delay(max)} \quad (2)$$

$$\text{gate\_delay(min)} = \text{cell\_delay(min)} + \text{wire\_delay(min)} \quad (3)$$

Next, a calculation method of the cell_delay and wire_delay constituting the gate_delay will be described.

FIG. 13 is a schematic diagram illustrating a delay calculation model of the gate_delay(typ) in the typical condition. In FIG. 13, the reference numeral 1 designates a delay calculation model of the cell_delay(typ) in the typical condition, and 2 designates a delay calculation model of the wire_delay(typ) in the typical condition.

The reference symbol VDD(typ) designates a power supply voltage in the typical condition; Rs(typ) designates a source resistance of the cell in the typical condition, Cd(typ) designates a diffusion capacitance of the cell in the typical condition; R(typ) designates a wiring resistance in the typical condition; and C(typ) designates a wiring capacitance in the typical condition.

First, when an automatic placement and routing apparatus of an integrated circuit design apparatus places a plurality of gates of a semiconductor integrated circuit and lays out routing among a plurality of gates, a conventional delay time calculation apparatus captures the results of the placement and routing to identify the delay calculation model of the gate_delay(typ) as illustrated in FIG. 13.

Subsequently, the conventional delay time calculation apparatus selects a target cell for the delay time calculation from among a plurality of cells, and determines the source resistance Rs(typ) and diffusion capacitance Cd(typ) of the cell in the typical condition, referring to the results of the placement and routing. Likewise, it determines the wiring resistance R(typ) and wiring capacitance C(typ) of the wiring connected to the cell in the typical condition.

Determining the source resistance Rs(typ), diffusion capacitance Cd(typ), wiring resistance R(typ) and wiring capacitance C(typ), the conventional delay time calculation apparatus calculates the cell_delay(typ) and wire_delay(typ) by substituting them into the following functions Fcell( ) and FWire().

$$\text{cell\_delay(typ)} = F\text{cell}(Rs(\text{typ}), Cd(\text{typ}), C(\text{typ}), R(\text{typ})) \quad (4)$$

$$\text{wire\_delay(typ)} = F\text{Wire}(Rs(\text{typ}), Cd(\text{typ}), C(\text{typ}), R(\text{typ})) \quad (5)$$

Calculating the cell_delay(typ) and wire_delay(typ), the conventional delay time calculation apparatus adds them to calculate the gate_delay(typ).

$$\text{gate\_delay(typ)} = \text{cell\_delay(typ)} + \text{wire\_delay(typ)} \quad (6)$$

So far, the calculation of the gate delay time in the typical condition, the gate_delay(typ), is described before the process variation (before the process in which transistor characteristics or wiring geometry varies, for example). The calculation of the gate delay time after the process variation will be described below.

As the factors of the process variation, there are transistor characteristic variation and wiring geometry variation.

The transistor characteristic variation corresponds to the variations in the source resistance Rs(typ) and diffusion capacitance Cd(typ) of FIG. 13. As for these variations, the following expressions hold.

$$Rs(\text{max}) > Rs(\text{typ}) > Rs(\text{min}) \quad (7)$$

$$Cd(\text{max}) > Cd(\text{typ}) > Cd(\text{min}) \quad (8)$$

where Rs(max) and Cd(max) are the source resistance and diffusion capacitance in the maximum condition, and Rs(min) and the Cd(min) are the source resistance and diffusion capacitance in the minimum condition.

On the other hand, the wiring geometry variation corresponds to the variations in the wiring capacitance C(typ) and wiring resistance R(typ) of FIG. 13.

FIG. 16 shows an example of the wiring geometry in a typical condition. The example includes a target wire 11 at the center. Surrounding the target wire 11, there are an upper wire 12 at the top, a lower wire 13 at the bottom, and adjacent wires 14 and 15 on both sides. The distance between the target wire 11 and upper wire 12 is TU, and the distance between the target wire 11 and lower wire 13 is TL. The wire width of the target wire 11 is L, the wiring spacing between the target wire 11 and adjacent wires 14 and 15 is S, and the wiring pitch is L+S.

In this case, the wiring resistance and wiring capacitance of the target wire 11 are R(typ) and C(typ), respectively.

FIG. 17 shows an example of a wiring geometry in a maximum condition. In the example, the distance between the target wire 11 and upper wire 12 is (TU−tu), and the distance between the target wire 11 and lower wire 13 is (TL−t1). The wire width of the target wire 11 is L+1, and the wiring spacing between the target wire 11 and adjacent wires 14 and 15 is (S−½). In this case, the wiring resistance and wiring capacitance of the target wire 11 are R(max) and C(max), respectively.

Compared with the wiring geometry in the typical condition of FIG. 16, the wiring geometry of FIG. 17 has the distance to the upper wire 12 reduced by tu, the distance to the lower wire 13 reduced by t1, the wire width increased by 1, and the wiring spacing reduced by ½. The wiring pitch, however, maintains its value L+S.

FIG. 18 shows an example of a wiring geometry in a minimum condition. In the example, the distance between the target wire 11 and upper wire 12 is (TU+tu), and the distance between the target wire 11 and lower wire 13 is (TL+t1). The wire width of the target wire 11 is L−1, and the wiring spacing between the target wire 11 and adjacent wires 14 and 15 is (S+½). In this case, the wiring resistance and wiring capacitance of the target wire 11 are R(min) and C(min), respectively.

Compared with the wiring geometry in the typical condition of FIG. 16, the wiring geometry of FIG. 18 has the distance to the upper wire 12 increased by tu, the distance to the lower wire 13 increased by t1, the wire width reduced by 1, and the wiring spacing increased by ½. The wiring pitch, however, maintains its value L+S.

The wiring resistance and the wiring capacitance have the following relationships.

$$R(max) < R(typ) < R(min) \quad (9)$$

$$C(max) > C(typ) > C(min) \quad (10)$$

As described above, the process variation consists of the transistor characteristic variation and wiring geometry variation. However, the conventional delay time calculation apparatus calculates the gate delay time after the process variation without using the actual values after the process variation. In other words, it uses none of the source resistances Rs(max) and Rs(min), diffusion capacitances Cd(max) and Cd(min), wiring resistances R(max) and R(min), and wiring capacitances C(max) and C(min) in the maximum and minimum conditions. Instead, it calculates the gate delay time using process variation coefficients KPcell(max) and KPcell(min) for the cell delay, and process variation coefficients KPWire(max) and KPWire(min) for the wire delay.

More specifically, as for the cell_delay(max) and cell_delay(min) in the maximum and minimum conditions, the conventional delay time calculation apparatus calculates them by multiplying the cell_delay(typ) in the typical condition by the process variation coefficients KPcell(max) and KPcell(min) for the cell delay, respectively.

Here, the process variation coefficients KPcell(max) and KPcell(min) for the cell delay are coefficients common to all the cells of the semiconductor integrated circuit rather than proper coefficients belonging to only the target cell for the delay time calculation.

$$\begin{aligned} \text{cell\_delay(max)} &= \text{cell\_delay}(typ) \times KPcell(max) \\ &= Fcell(Rs(typ), Cd(typ), C(typ), R(typ)) \times \\ &\quad KPcell(max) \end{aligned} \quad (11)$$

$$\begin{aligned} \text{cell\_delay(min)} &= \text{cell\_delay}(typ) \times KPcell(min) \\ &\quad Fcell(Rs(typ), Cd(typ), C(typ), R(typ)) \times \\ &\quad KPcell(min) \end{aligned} \quad (12)$$

Likewise, as for the wire_delay(max) and wire_delay(min) in the maximum and minimum conditions, the conventional delay time calculation apparatus calculates them by multiplying the wire_delay(typ) in the typical condition by the process variation coefficients KPWire(max) and KPWire(min), respectively.

The process variation coefficients KPWire(max) and KPWire(min) for the wire delay, however, are values determined by considering only variations in the wiring resistance R(typ) and wiring capacitance C(typ) under the assumption that all the cells of the semiconductor integrated circuit have the same source resistance Rs(typ) and diffusion capacitance Cd(typ).

$$\begin{aligned} \text{wire\_delay(max)} &= \text{wire\_delay}(typ) \times KPWire(max) \\ &= FWire(Rs(typ), Cd(typ), C(typ), R(typ)) \times \\ &\quad KPWire(max) \end{aligned} \quad (13)$$

$$\begin{aligned} \text{wire\_delay(min)} &= \text{wire\_delay}(typ) \times KPWire(min) \\ &= FWire(Rs(typ), Cd(typ), C(typ), R(typ)) \times \\ &\quad KPWire(min) \end{aligned} \quad (14)$$

Calculating the cell_delay(max) and cell_delay(min) and the wire_delay(max) and wire_delay(min) after the process variation as described above, the conventional delay time calculation apparatus calculates the gate_delay(max) and gate_delay(min) after the process variation by adding the cell delay and wire delay after the process variation (see, FIGS. 14 and 15).

$$\text{gate\_delay(max)} = \text{cell\_delay(max)} + \text{wire\_delay(max)} \quad (15)$$

$$\text{gate\_delay(min)} = \text{cell\_delay(min)} + \text{wire\_delay(min)} \quad (16)$$

The conventional delay time calculation apparatus with the foregoing configuration has the following problem. Although it can calculate the delay time of the gate accurately when the process variation coefficients KPcell(max) and KPcell(min) for the cell delay and the process variation coefficients KPWire(max) and KPWire(min) for the wiring match the target gate of the delay time calculation, it cannot calculate the delay time of the gate when the errors of the process variation coefficients increase.

In particular, as for the process variation coefficients KPWire(max) and KPWire(min) for the wiring, they are determined considering only the variations in the wiring resistance R(typ) and wiring capacitance C(typ) under the assumption that the source resistance Rs(typ) and diffusion capacitance Cd(typ) are the same to all the cells of the semiconductor integrated circuit. Accordingly, when the source resistance of the cell Rs(typ) and diffusion capacitance Cd(typ), to which the wires are connected, differ from the foregoing values, the errors of the process variation coefficients KPWire(max) and KPWire(min) for the wiring increase.

SUMMARY OF THE INVENTION

The present invention is implemented to solve the foregoing problem. It is therefore an object of the present invention to provide a delay time calculation apparatus and integrated circuit design apparatus capable of calculating the delay time of a gate accurately.

According to a first aspect of the present invention, there is provided a delay time calculation apparatus including: a resistance-capacitance determining section for determining, referring to the placement and routing results obtained by a placement and routing result acquiring section, a source resistance and a diffusion capacitance of a target gate of delay time calculation before a process variation, and a wiring resistance and a wiring capacitance of a wire connected to the gate after the process variation; and a delay time calculating section for calculating the delay time of the gate according to results determined by the resistance-capacitance determining section. Thus, it offers an advantage of being able to calculate the delay time of the gate accurately.

According to a second aspect of the present invention, there is provided an integrated circuit design apparatus including: a resistance-capacitance determining section for determining, referring to the placement and routing results obtained by a placement and routing result acquiring section, a source resistance and a diffusion capacitance of a target gate of delay time calculation before a process variation, and a wiring resistance and a wiring capacitance of a wire connected to the gate after the process variation; a delay time calculating section for calculating the delay time of the gate according to results determined by the resistance-capacitance determining section; and a verifying section for verifying the placement and routing results by the placement and routing section, referring to the delay time calculated by the delay time calculating section. Thus, it offers an advantage of being able to alter the placement and the like if the results of the placement and routing have something unsatisfactory.

DETAILED DESCRIPTION OF THE PREFERRED EMBODIMENTS

The invention will now be described with reference to the accompanying drawings.

Embodiment 1

Figure 1:
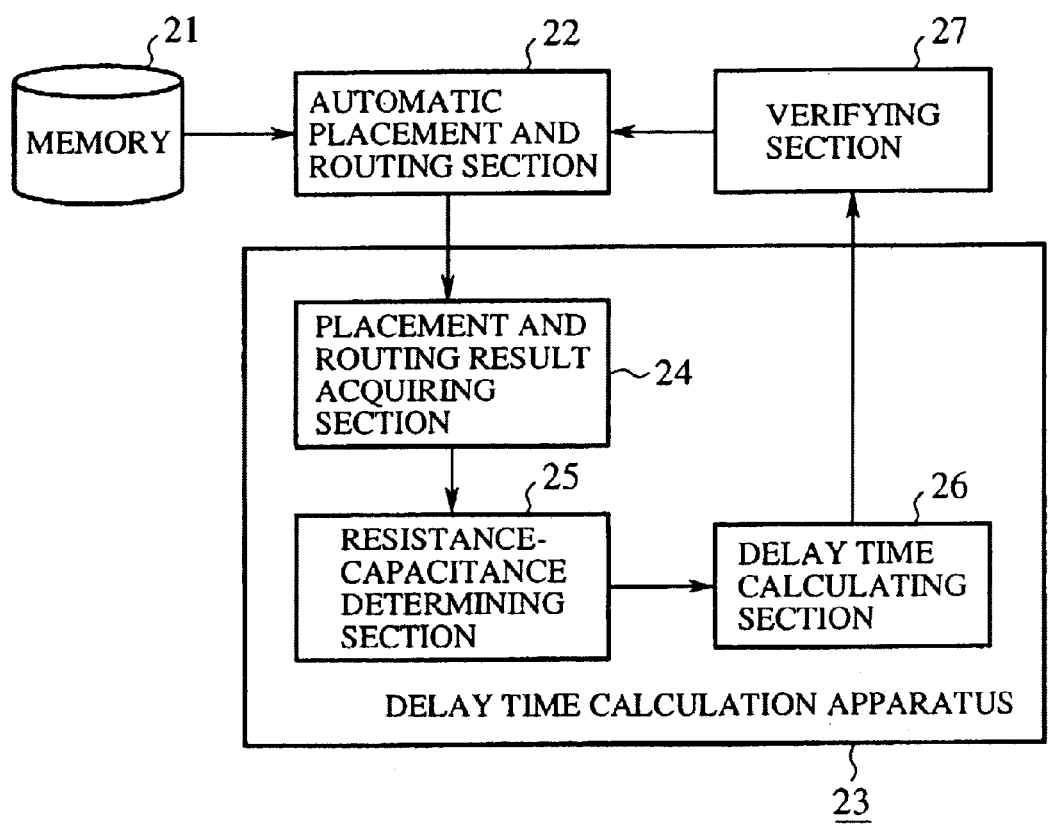
FIG. 1 is a block diagram showing a configuration of an embodiment 1 of the integrated circuit design apparatus in accordance with the present invention.

FIG. 1 is a block diagram showing a configuration of an embodiment 1 of the integrated circuit design apparatus in accordance with the present invention. In FIG. 1, the reference numeral 21 designates a memory for storing placing conditions of a plurality of gates of the semiconductor integrated circuit and routing conditions between the gates; and 22 designates an automatic placement and routing section for placing the gates considering the placing conditions stored in the memory 21, and for routing between the gates considering the routing conditions. The reference numeral 23 designates a delay time calculation apparatus for calculating gate delay time after a process variation; and 24 designates a placement and routing result acquiring section for obtaining placement results of the gates and the routing results between the gates the automatic placement and routing section 22 generates.

The reference numeral 25 designates a resistance-capacitance determining section for determining the source resistance Rs(typ) and diffusion capacitance Cd(typ) of a target gate whose delay time is to be calculated before the process variation, and for determining the wiring resistances R(max) and R(min) and wiring capacitances C(max) and C(min) of a wire connected to the gate after the process variation according to the results of the placement and routing the placement and routing result acquiring section 24 obtains; and 26 designates a delay time calculating section for calculating the delay time of the gate according to the contents the resistance-capacitance determining section 25 determines. The reference numeral 27 designates a verifying section for verifying the results of the placement and routing by the automatic placement and routing section 22 referring to the delay time the delay time calculating section 26 calculates.

Figure 2:
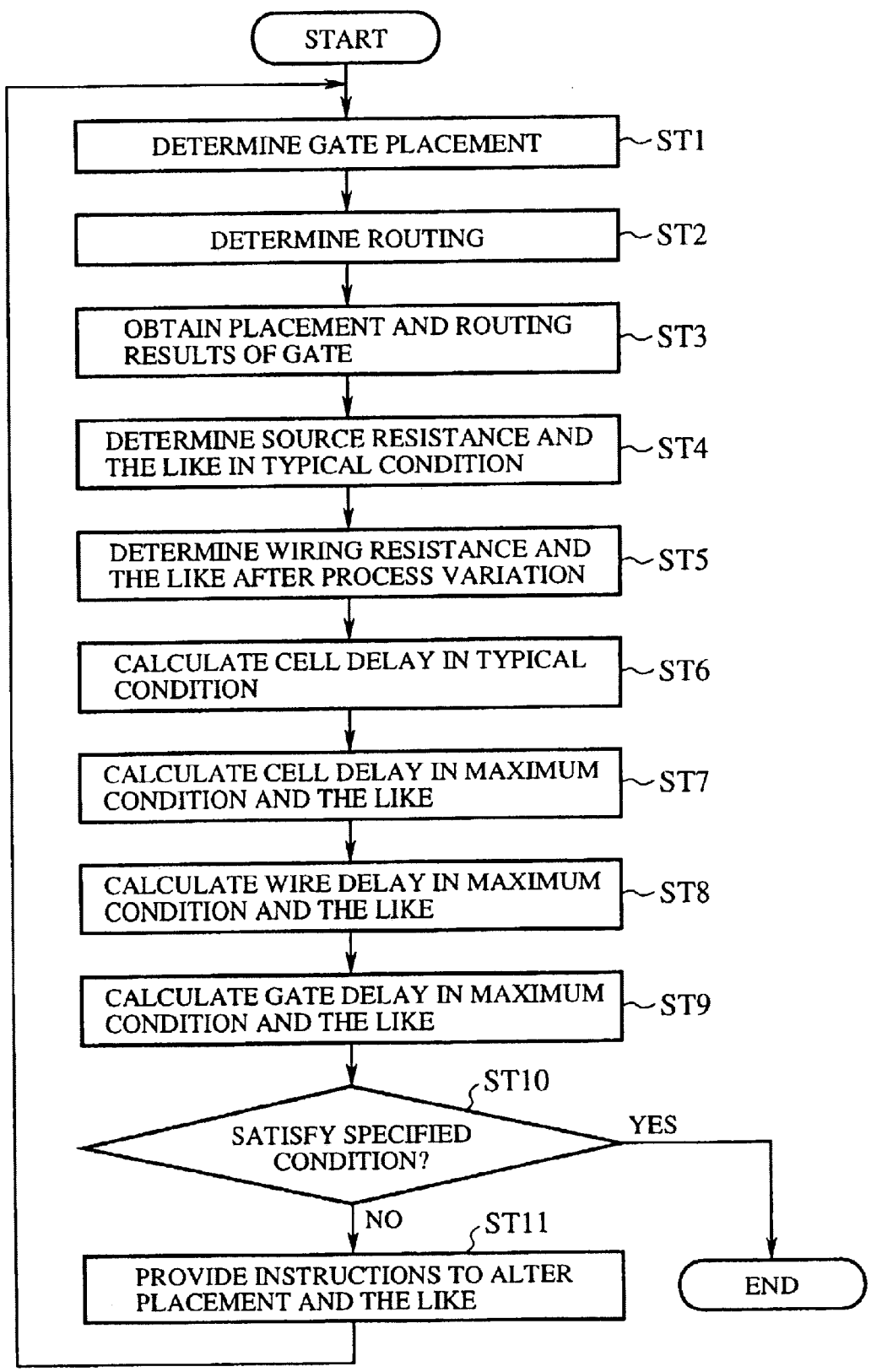
FIG. 2 is a flowchart illustrating a procedure of the embodiment 1 of the integrated circuit design apparatus in accordance with the present invention.

FIG. 2 is a flowchart illustrating a procedure of the embodiment 1 of the integrated circuit design apparatus in accordance with the present invention.

Incidentally, although all the components of the integrated circuit design apparatus of FIG. 1 can be composed of hardware, this is not essential. For example, software describing the processing of the components can be prepared so that a computer not shown in FIG. 1 executes the software.

Next, the operation of the present embodiment 1 will be described.

First, the automatic placement and routing section 22 reads from the memory 21 information about cells such as about cell frame and pin positions, and gate placing conditions describing information about placeable regions of cells, and determines placement of the gates considering the placing conditions (step ST1).

Subsequently, the automatic placement and routing section 22 reads from the memory 21 the routing conditions describing the interconnections between the individual gates and a minimum spacing between adjacent wires, and determines the routing of the wires connecting the gates considering the routing conditions (step ST2).

After the automatic placement and routing section 22 completes the placement and routing processing of the gates, the placement and routing result acquiring section 24 of the delay time calculation apparatus 23 receives the placement results of the gates and the routing results between the gates the automatic placement and routing section 22 produces (step ST3).

When the placement and routing result acquiring section 24 receives the placement results of the gates and the routing results between the gates, the resistance-capacitance determining section 25 of the delay time calculation apparatus 23 determines the source resistance Rs(typ) and diffusion capacitance Cd(typ) of the target gate of the delay time calculation in the typical condition, referring to the results of the placement and routing (step ST4).

Referring to the results of the placement and routing, the resistance-capacitance determining section 25 determines as to the wire connected to the gate the wiring resistance R(typ) and wiring capacitance C(typ) in the typical condition, and the wiring resistances R(max) and R(min) and wiring capacitances C(max) and C(min) in the maximum and minimum conditions (step ST5).

More specifically, to determine the source resistance Rs(typ) and diffusion capacitance Cd(typ) of the gate in the typical condition, the resistance-capacitance determining section 25 determines them by carrying out a circuit simulation in accordance with the circuit information within the gate. When the source resistance Rs(typ) and diffusion capacitance Cd(typ) in the typical condition are stored in the memory 21 in advance, they are read from the memory 21.

Figure 3A:
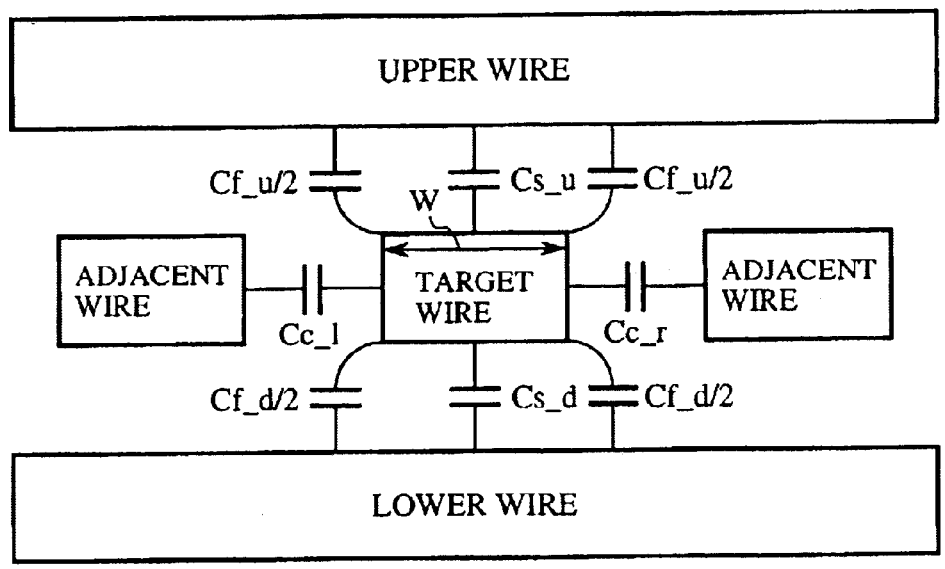
FIGS. 3A and 3B are schematic diagrams illustrating relationships between a target wire and other wires.
Figure 3B:
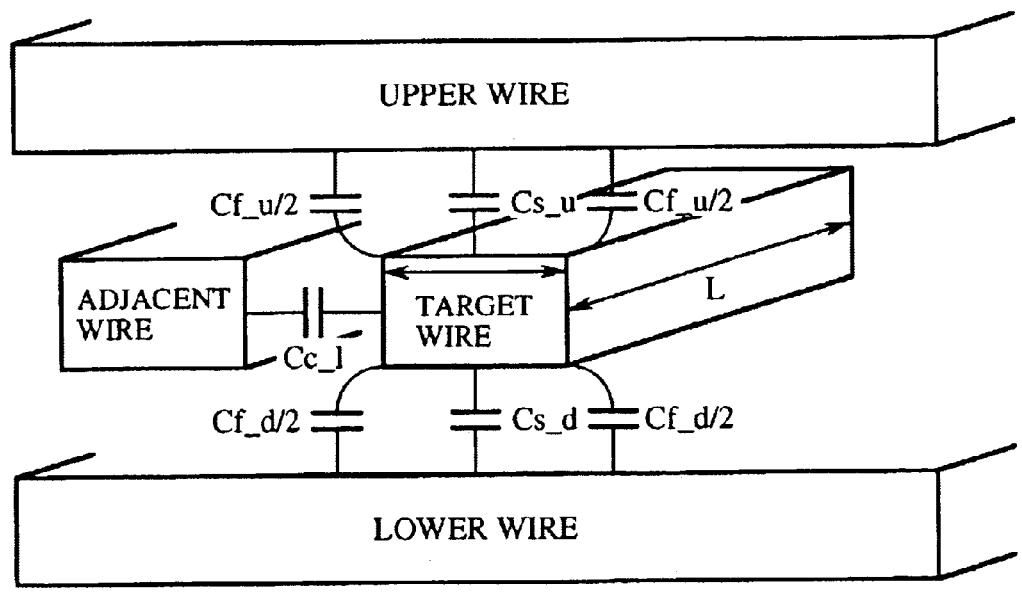

In addition, to determine the wiring resistance R(typ) and wiring capacitance C(typ) of the target wire as shown in FIGS. 3A and 3B, referring to the routing results the automatic placement and routing section 22 outputs, the resistance-capacitance determining section 25 obtains a parallel plate capacitance Cs_u and a fringe capacitance Cf_u by checking the wiring spacing between the target wire and the upper wire. The parallel plate capacitance Cs_u and fringe capacitance Cf_u are uniquely determined by the wiring spacing between the target wire and the upper wire. Likewise, it obtains the parallel plate capacitance Cs_d and fringe capacitance Cf_d by checking the wiring spacing between the target wire and the lower wire. Furthermore, it obtains coupling capacitances Cc_l and Cc_r by checking the wiring spacing between the target wire and adjacent wires.

Subsequently, the resistance-capacitance determining section 25 determines the wiring resistance R(typ) and wiring capacitance C(typ) in the typical condition by substituting the parallel plate capacitance Cs_u and the like into the following expression.

$$R(\text{typ}) = R\text{sheet} \times L/W \tag{17}$$

$$C(\text{typ}) = Cs\_u \times W \times L + Cs\_d \times W \times L + Cf\_u \times L + Cf\_d \times L + Cc\_r \times L + Cc\_l \times L \tag{18}$$

where W is the wire width of the target wire, L is its wiring length and Rsheet is its sheet resistance.

Although the method of determining the wiring resistance R(typ) and wiring capacitance C(typ) in the typical condition is described above, the wiring resistances R(max) and R(min) and wiring capacitances C(max) and C(min) after the process variation can also be calculated by obtaining the parallel plate capacitance Cs_u and the like by checking the wiring spacing between the target wire and upper wire and the like.

Figure 4:
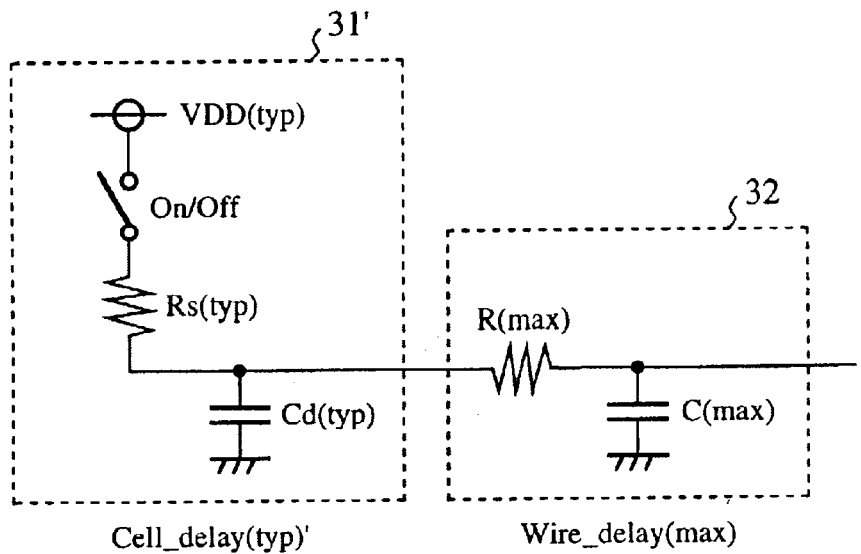
FIG. 4 is a schematic diagram illustrating a delay calculation model of a gate_delay(max) in a maximum condition.
Figure 5:
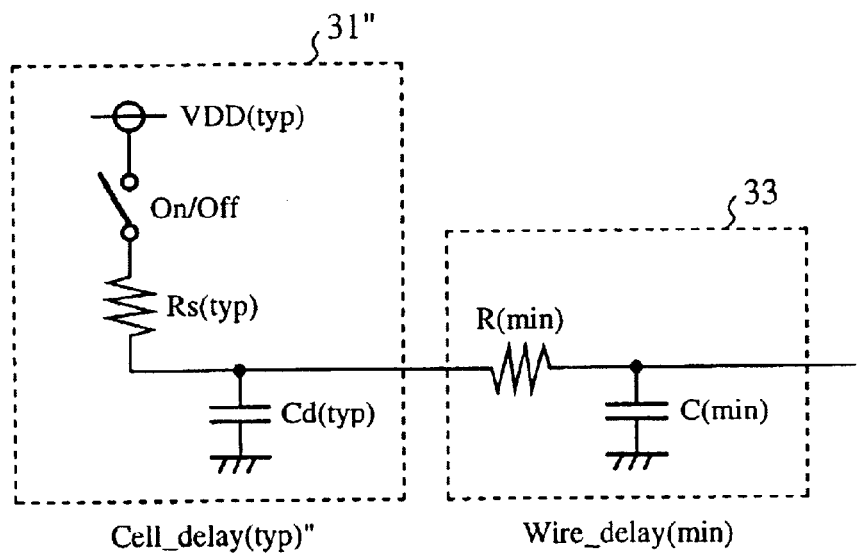
FIG. 5 is a schematic diagram illustrating a delay calculation model of a gate_delay(min) in a minimum condition.

FIG. 4 is a schematic diagram illustrating a delay calculation model of the gate_delay(max) in the maximum condition, and FIG. 5 is a schematic diagram illustrating a delay calculation model of the gate_delay(min) in the minimum condition. In FIGS. 4 and 5, the reference numeral 31 designates a delay calculation model of the cell_delay (typ) in the typical condition; 32 designates a delay calculation model of the wire_delay(max) in the maximum condition; and 33 designates a delay calculation model of the wire_delay(min) in the minimum condition.

The reference symbol VDD(typ) designates a power supply voltage in the typical condition; Rs(typ) designates the source resistance of the cell in the typical condition; Cd(typ) designates a diffusion capacitance of the cell in the typical condition cell; R(max) designates a wiring resistance in the maximum condition; C(max) designates a wiring capacitance in the maximum condition; R(min) designates a wiring resistance in the minimum condition; and C(min) designates a wiring capacitance in the minimum condition.

When the resistance-capacitance determining section 25 determines the source resistance Rs(typ), diffusion capacitance Cd(typ), wiring resistance R(typ) and wiring capacitance C(typ) in the typical condition as described above, the delay time calculating section 26 of the delay time calculation apparatus 23 substitutes them into the following function Fcell( ), thereby calculating the cell_delay(typ)' and cell_delay(typ)" in the typical condition (step ST6).

$$\text{cell\_delay(typ)}' = F\text{cell}(Rs(\text{typ}), Cd(\text{typ}), C(\text{max}), R(\text{max})) \tag{19}$$

$$\text{cell\_delay(typ)}'' = F\text{cell}(Rs(\text{typ}), Cd(\text{typ}), C(\text{min}), R(\text{min})) \tag{19}'$$

Subsequently, the delay time calculating section 26 calculates the cell_delay(max) and cell_delay(min) in the maximum and minimum conditions by multiplying the cell_delay(typ)' and cell_delay(typ)" in the typical condition by the process variation coefficients KPcell(max) and KPcell(min) for the cell delay, respectively (step ST7).

Although the process variation coefficients KPcell(max) and KPcell(min) for the cell delay are basically common values to all the cells of the semiconductor integrated circuit rather than proper values associated with the target cell for the delay time calculation, they can be proper values to the cell as needed.

$$\begin{aligned}\text{cell\_delay(max)} &= \text{cell\_delay}(\text{typ})' \times KP\text{cell}(\text{max}) \\ &= F\text{cell}(Rs(\text{typ}), Cd(\text{typ}), C(\text{max}), R(\text{max})) \times \\ &\quad KP\text{cell}(\text{max})\end{aligned} \tag{20}$$

$$\begin{aligned}\text{cell\_delay(min)} &= \text{cell\_delay}(\text{typ})'' \times KP\text{cell}(\text{min}) \\ &= F\text{cell}(Rs(\text{typ}), Cd(\text{typ}), C(\text{min}), R(\text{min})) \times \\ &\quad KP\text{cell}(\text{min})\end{aligned} \tag{21}$$

When the resistance-capacitance determining section 25 determines the source resistance Rs(typ) and diffusion capacitance Cd(typ) in the typical condition and the wiring resistance R(max) and R(min) and the wiring capacitance C(max) and C(min) in the maximum and minimum conditions as described above, the delay time calculating section 26 calculates the wire_delay(max) and wire_delay(min) in the maximum and minimum conditions by substituting them into the following function FWire( ) (step ST8).

$$\text{wire\_delay(max)} = F\text{Wire}(Rs(\text{typ}), Cd(\text{typ}), C(\text{max}), R(\text{max})) \tag{22}$$

$$\text{wire\_delay(min)} = F\text{Wire}(Rs(\text{typ}), Cd(\text{typ}), C(\text{min}), R(\text{min})) \tag{23}$$

Calculating the cell delays cell_delay(max) and cell_delay(min) after the process variation and the wire delays wire_delay(max) and wire_delay(min) after the process variation as described above, the delay time calculating section 26 calculates the gate delays gate_delay(max) and gate_delay(min) after the process variation by adding the cell delays and the wire delay after the process variation (step ST9).

$$\text{gate\_delay(max)} = \text{cell\_delay(max)} + \text{wire\_delay(max)} \tag{24}$$

$$\text{gate\_delay(min)} = \text{cell\_delay(min)} + \text{wire\_delay(min)} \tag{25}$$

When the delay time calculating section 26 calculates the gate delays gate_delay(max) and gate_delay(min) after the process variation, the verifying section 27 verifies the results of the placement and routing by the automatic placement and routing section 22 referring to the gate delays gate_delay(max) and gate_delay(min).

More specifically, the verifying section 27 carries out the following processing. First, it makes a decision as to whether the gate delays gate_delay(max) and gate_delay (min) satisfy the specified conditions (step ST10). Second, if the specified conditions are not satisfied, it recognizes that the placement results or routing results by the automatic placement and routing section 22 have something unsatisfactory, and provides instructions to the automatic placement and routing section 22 to alter the placement or routing of the gate (step ST11).

For example, if the gate_delay(max) exceeds the upper limit of the delay time, the verifying section 27 provides instructions to the automatic placement and routing section 22 to reduce the spacing between the gate and its adjacent gates.

Receiving the instructions to alter the placement or routing of the gates from the verifying section 27, the automatic placement and routing section 22 moves the placement and/or routing of the gates in accordance with the instructions.

Although the automatic placement and routing section 22 in the present embodiment 1 alters the placement and/or routing of the gates when it receives the instructions to alter the placement or routing of the gates, it is also possible to change the placing conditions and the like of the gates that are stored in the memory 21. In other words, the circuit design itself can be changed.

As described above, the present embodiment 1 is configured such that it includes the resistance-capacitance determining section 25 which determines the source resistance and diffusion capacitance of the target gate of the delay time calculation before the process variation referring to the results of the placement and routing obtained by the placement and routing result acquiring section 24, and which determines the wiring resistance and wiring capacitance of the wire connected to the gate after the process variation; and that it calculates the delay time of the gate in accordance with the results the resistance-capacitance determining section 25 determines. As a result, it can calculate the gate delay after the process variation without using the process variation coefficients KPWire(max) and KPWire(min) for the wiring which are used by the conventional apparatus. Thus, the present embodiment 1 offers an advantage of being able to calculate the delay time of the gate accurately.

Embodiment 2

Although the foregoing embodiment 1 calculates the gate delays after the process variation, they can vary with temperature because the wiring resistance R(typ) varies with temperature.

In view of this, the gate delays after the process variation can be calculated as follows using the temperature variation coefficients KTWire(max) and KTWire(min) considering the temperature variations (see, FIGS. 4 and 5).

$$\text{wire\_delay(max)}=F\text{Wire}(Rs(\text{typ}), Cd(\text{typ}), C(\text{max}), R(\text{max}))\times KT\text{Wire(max)} \quad (26)$$

$$\text{wire\_delay(min)}=F\text{Wire}(Rs(\text{typ}), Cd(\text{typ}), C(\text{min}), R(\text{min}))\times KT\text{Wire(min)} \quad (27)$$

The temperature variation coefficients KTWire(max) and KTWire(min), however, are determined considering only the variations in the wiring resistance R(typ) under the assumption that all the cells of the semiconductor integrated circuit have the same source resistance Rs(typ) and diffusion capacitance Cd(typ). Accordingly, if the source resistance Rs(typ) and diffusion capacitance Cd(typ) of the cell to which the wire is connected differ greatly from the assumed values, the errors of the temperature variation coefficients KTWire(max) and KTWire(min) increase.

Figure 6:
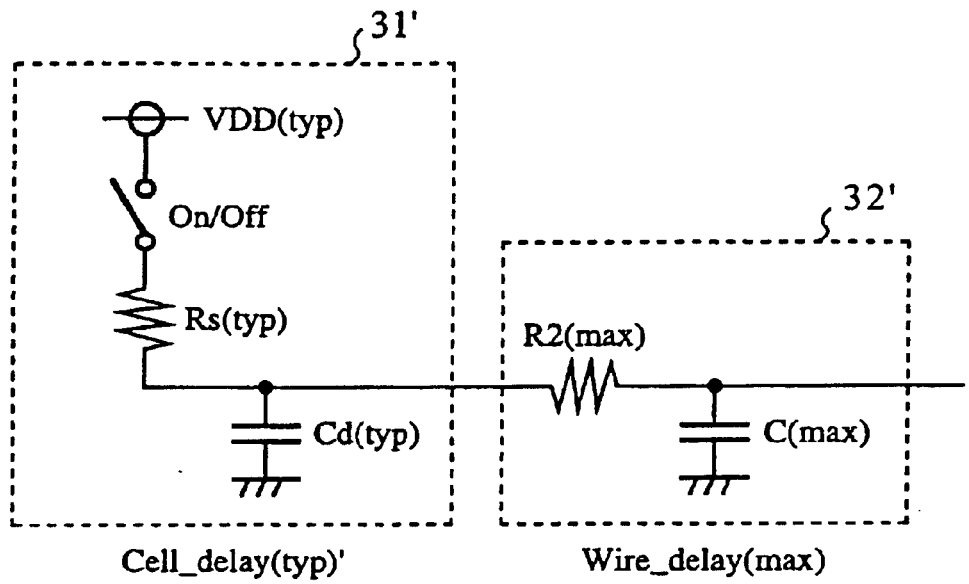
FIG. 6 is a schematic diagram illustrating a delay calculation model of a gate_delay(max) in a maximum condition.
Figure 7:
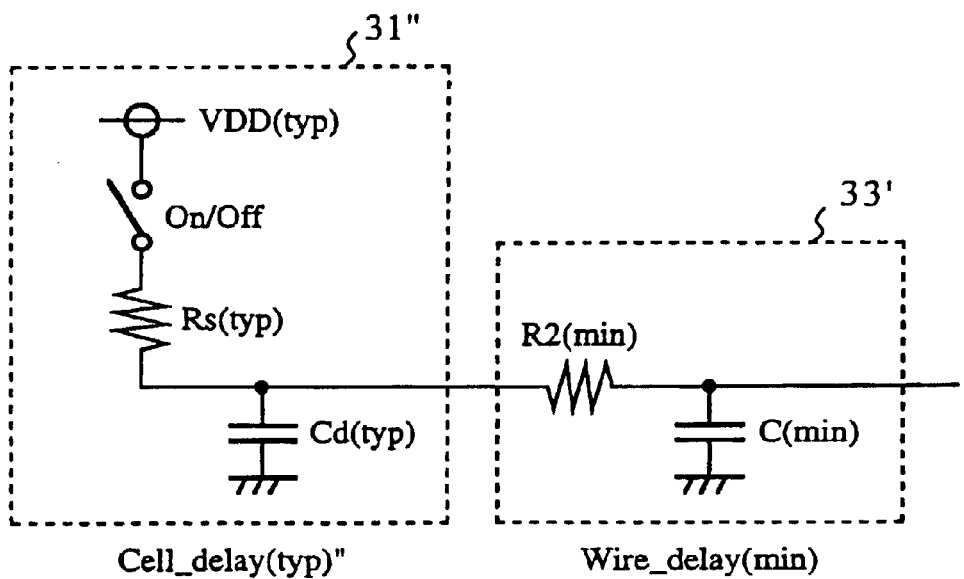
FIG. 7 is a schematic diagram illustrating a delay calculation model of a gate_delay(min) in a minimum condition.

Considering this, the present embodiment 2 is configured such that it can calculate the wire_delay(max) and wire_delay(min) in the maximum and minimum conditions without using the temperature variation coefficients KTWire (max) and KTWire(min). To achieve this, the resistance-capacitance determining section 25 is designed to determine the wiring resistance considering the dependence of the resistance on the temperature when determining the wiring resistances R2(max) and R2(min) after the process variation (see, FIGS. 6 and 7).

More specifically, the present embodiment 2 calculates the wiring resistances R2(max) and R2(min) after the process variation by the following expressions instead of the foregoing expression (17).

$$R(\text{max})=R\text{sheet}\times L/W\times KT \quad (28)$$

$$R(\text{min})=R\text{sheet}\times L/W\times KT \quad (28)'$$

where KT is the temperature coefficient proper to the wiring resistance.

When the resistance-capacitance determining section 25 determines the wiring resistances R2 (max) and R2 (min) in the maximum and minimum conditions considering the dependence of the resistance on the temperature, the delay time calculating section 26 calculates the wire_delay(max) and wire_delay(min) in the maximum and minimum conditions using the function FWire( ) as the foregoing embodiment 1.

$$\text{wire\_delay(max)}=F\text{Wire}(Rs(\text{typ}), Cd(\text{typ}), C(\text{max}), R2 \text{ (max)}) \quad (29)$$

$$\text{wire\_delay(min)}=F\text{Wire}(Rs(\text{typ}), Cd(\text{typ}), C(\text{min}), R2 \text{ (min)}) \quad (30)$$

Since the subsequent operation is the same as that of the foregoing embodiment 1, the description thereof is omitted here.

The present embodiment 2 can calculate the wire delays wire_delay(max) and wire_delay(min) in the maximum and minimum conditions without using the temperature variation coefficients KTWire(max) and KTWire(min). As a result, it offers an advantage of being able to calculate the delay time of the gate accurately in spite of the temperature variations.

Embodiment 3

The foregoing embodiments 1 and 2 calculate the cell delays cell_delay(max) and cell_delay(min) in the maximum and minimum conditions by multiplying the cell delays cell_delay(typ)' and cell_delay(typ)" in the typical condition by the process variation coefficients KPcell(max) and KPcell(min) for the cell delay. However, since the process variation coefficients KPcell(max) and KPcell(min) for the cell delay are values common to all the cells of the semiconductor integrated circuit rather than the values proper to the target cell for the delay time calculation, they can include large errors depending on the target cell for the delay time calculation.

Figure 8:
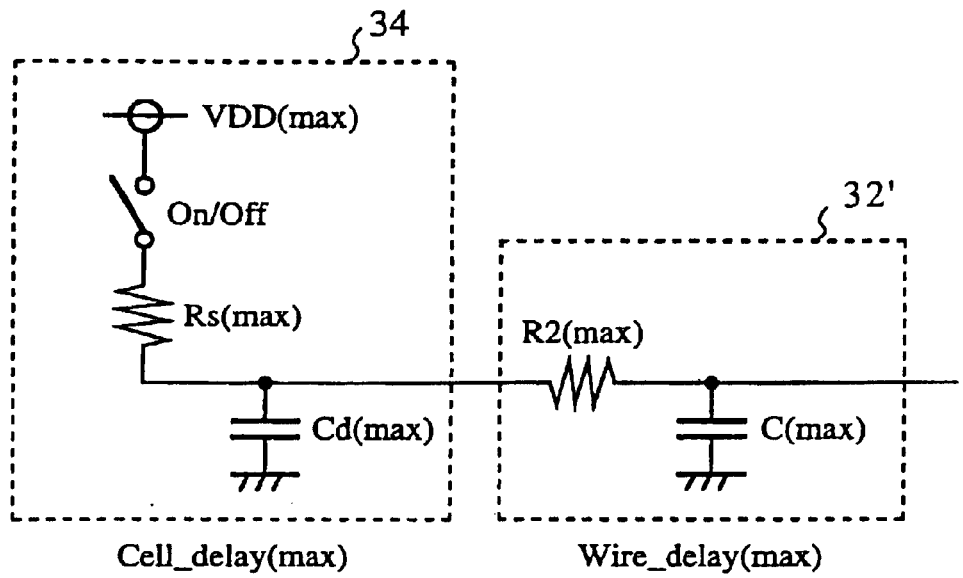
FIG. 8 is a schematic diagram illustrating a delay calculation model of a gate_delay(max) in a maximum condition.
Figure 9:
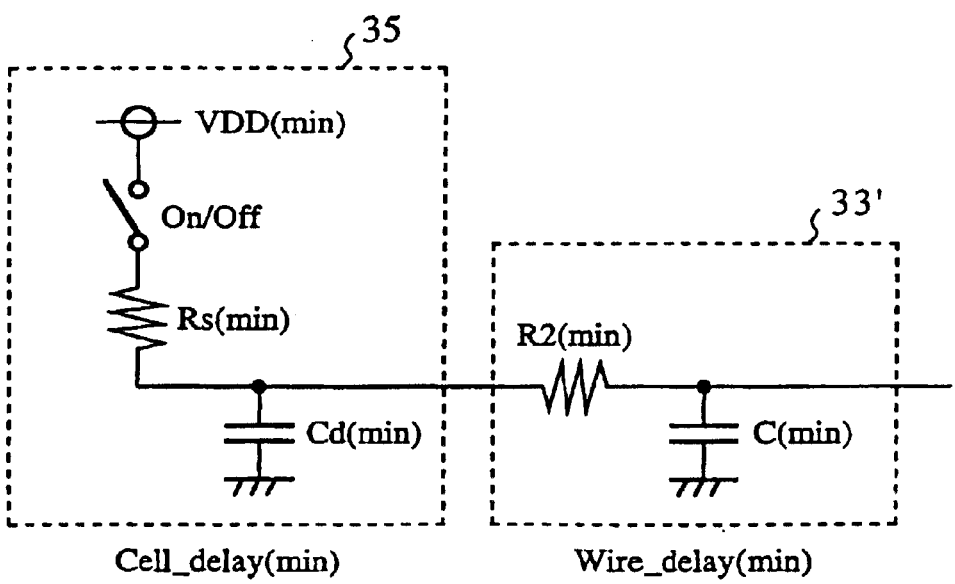
FIG. 9 is a schematic diagram illustrating a delay calculation model of a gate_delay(min) in a minimum condition.
Figure 10:
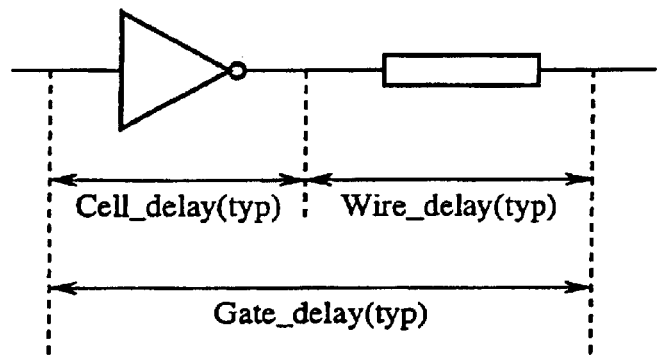
FIG. 10 is a schematic diagram illustrating a gate_delay (typ) in a typical condition.
Figure 11:
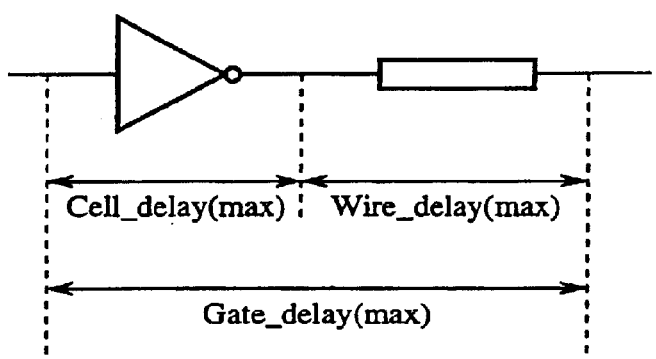
FIG. 11 is a schematic diagram illustrating a gate_delay (max) in a maximum condition.
Figure 12:
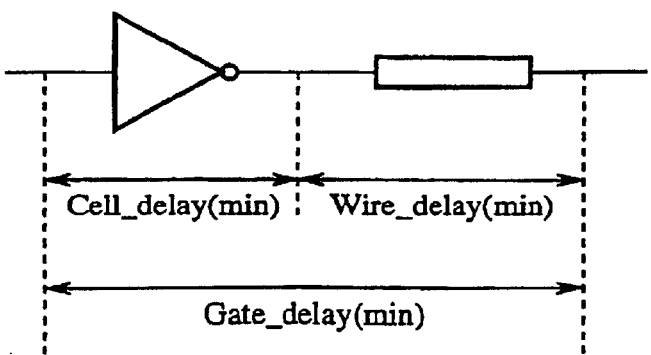
FIG. 12 is a schematic diagram illustrating a gate_delay (min) in a minimum condition.
Figure 13:
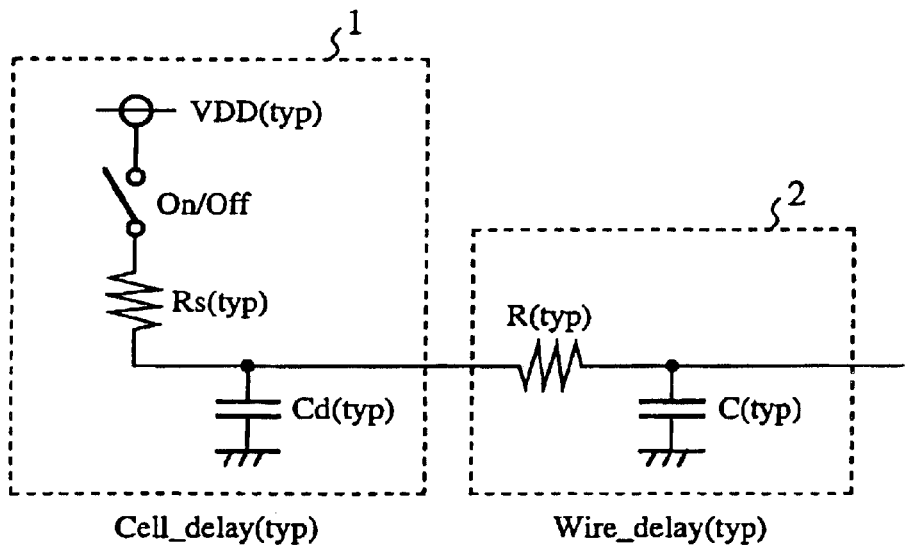
FIG. 13 is a schematic diagram illustrating a delay calculation model of a gate_delay(typ) in a typical condition.
Figure 14:
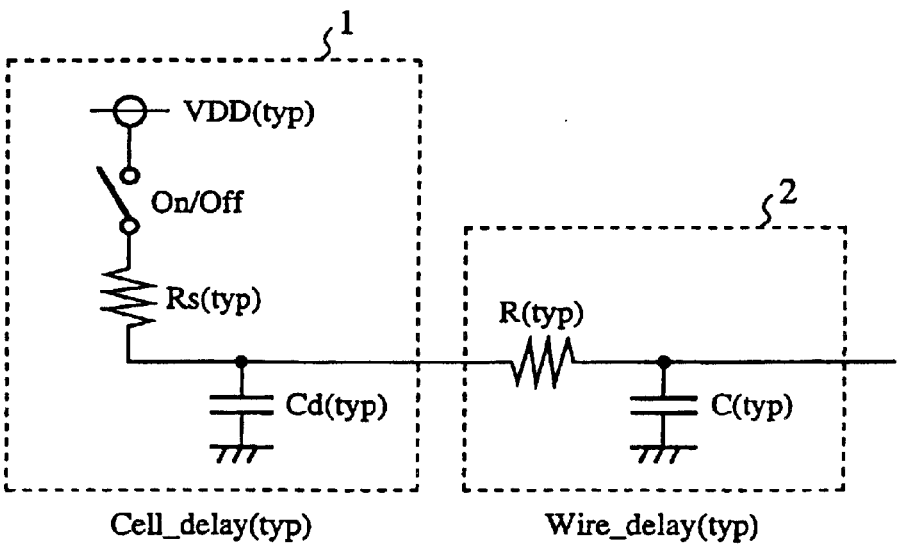
FIG. 14 is a schematic diagram illustrating a conventional delay calculation model of a gate_delay(max) in a maximum condition.
Figure 15:
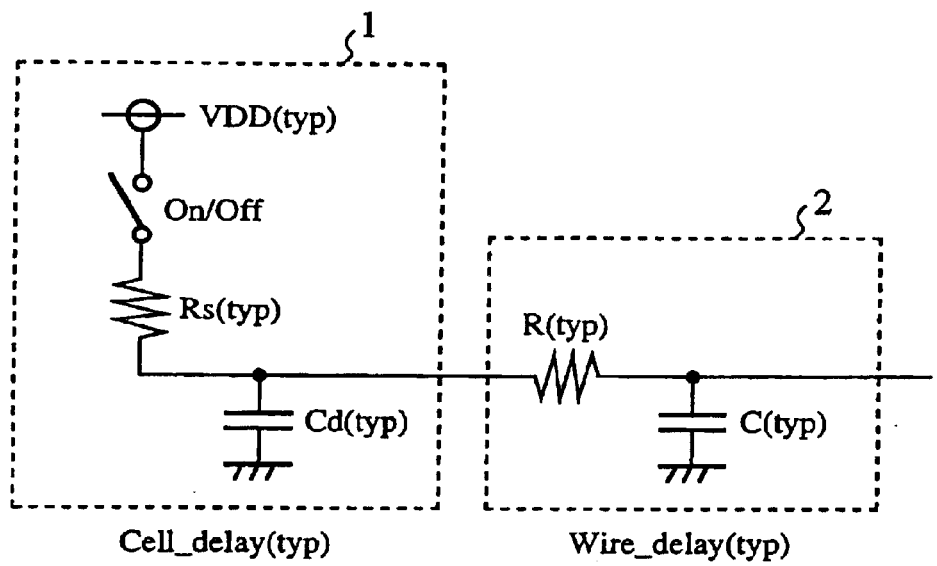
FIG. 15 is a schematic diagram illustrating a conventional delay calculation model of a gate_delay(min) in a minimum condition.
Figure 16:
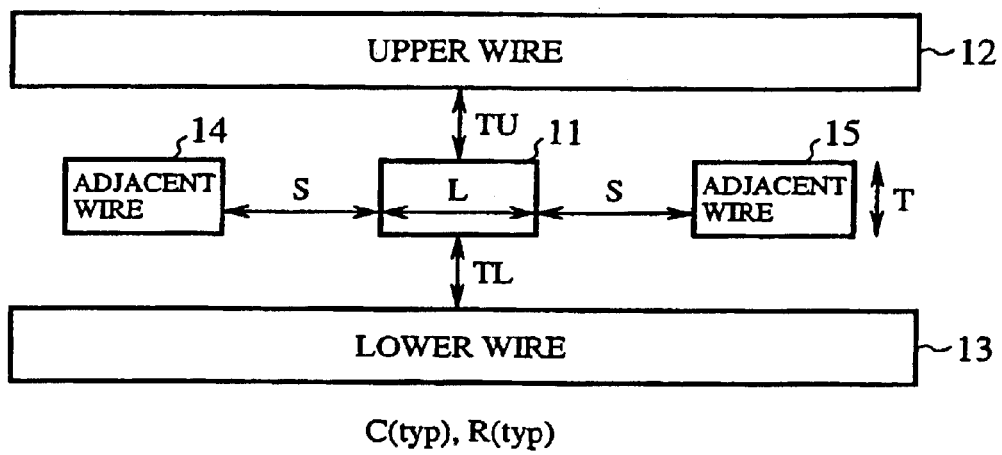
FIG. 16 is a schematic diagram illustrating an example of a wiring geometry in a typical condition.
Figure 17:
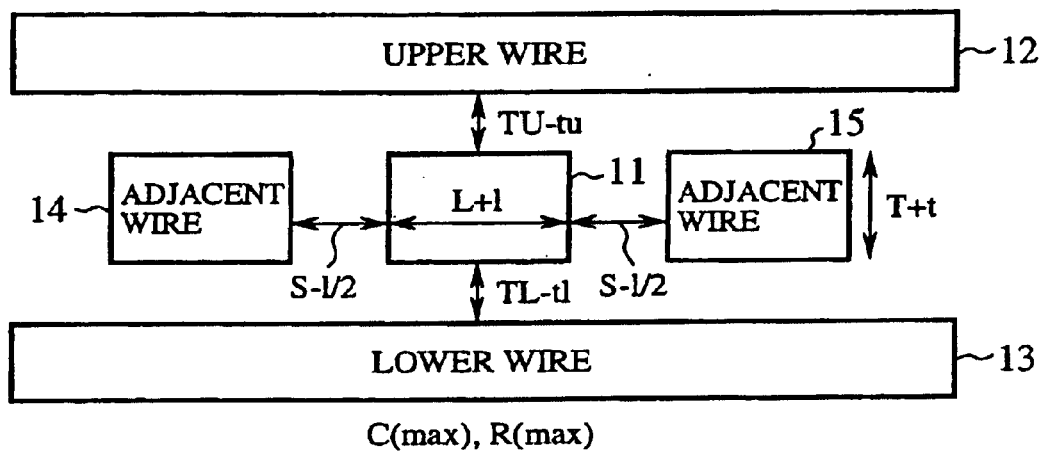
FIG. 17 is a schematic diagram illustrating an example of a wiring geometry in a maximum condition.
Figure 18:
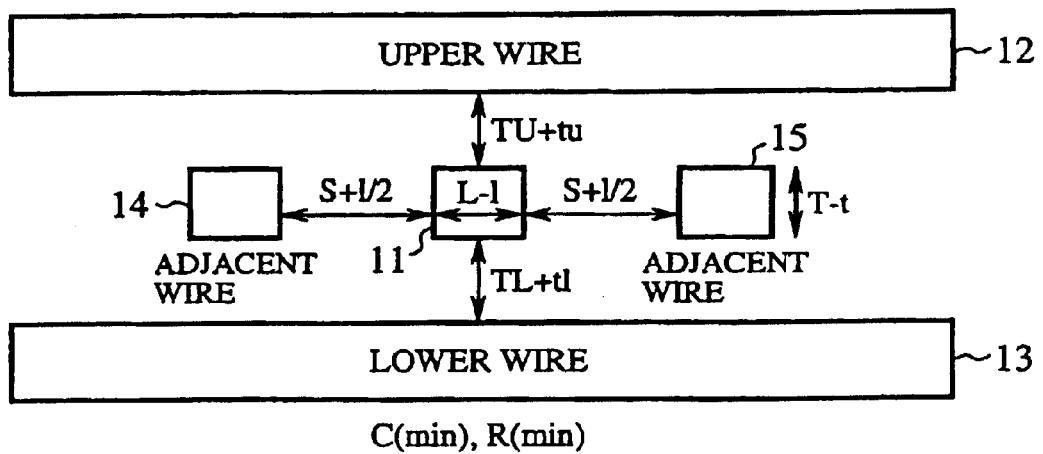
FIG. 18 is a schematic diagram illustrating an example of a wiring geometry in a minimum condition.

In view of this, to achieve the calculation of the cell delays cell_delay(max) and cell_delay(min) in the maximum and minimum conditions without using the process variation coefficients KPcell(max) and KPcell(min), the present embodiment 3 has the resistance-capacitance determining section 25 determine the source resistances Rs(max) and Rs(min) and the diffusion capacitances Cd(max) and Cd(min) in the maximum and minimum conditions instead of the source resistances Rs(typ) and diffusion capacitance Cd(typ) in the typical condition. In FIGS. 8 and 9, the reference numeral 34 designates a delay calculation model of the cell_delay(max) in the maximum condition, and 35 designates a delay calculation model of the cell_delay(min) in the minimum condition.

When the resistance-capacitance determining section 25 determines the source resistances Rs(max) and Rs(min) and the diffusion capacitances Cd(max) and Cd(min) in the maximum and minimum conditions, the delay time calculating section 26 calculates the cell delays cell_delay(max) and cell_delay(min) in the maximum and minimum conditions using the function Fcell( ) as in the foregoing embodiments 1 and 2.

$$\text{cell\_delay(max)} = F\text{cell}(Rs(\text{max}), Cd(\text{max}), C(\text{max}), R(\text{max})) \quad (31)$$

$$\text{cell\_delay(min)} = F\text{cell}(Rs(\text{min}), Cd(\text{min}), C(\text{min}), R(\text{min})) \quad (32)$$

Since the subsequent operation is the same as that of the foregoing embodiments 1 and 2, the description thereof is omitted here.

The present embodiment 3 can calculate the cell delays cell_delay(max) and cell_delay(min) in the maximum and minimum conditions without using the process variation coefficients KPcell(max) and KPcell(min) for the cell delay. Thus, it offers an advantage of being able to calculate the delay time of the gate more accurately.

Although the foregoing embodiments 1–3 do not refer specifically, since the transistor characteristic variation and the wiring geometry variation are independent events, the opposite combination as to the maximum and minimum such as the maximum for the transistor and minimum for the wiring geometry can also enable the delay calculation.

Accordingly, the foregoing expressions (31) and (32) can be changed as follows.

$$\text{cell\_delay(max)} = F\text{cell}(Rs(\text{max}), Cd(\text{max}), C(\text{min}), R(\text{min})) \quad (31)'$$

$$\text{cell\_delay(min)} = F\text{cell}(Rs(\text{min}), Cd(\text{min}), C(\text{max}), R(\text{max})) \quad (32)'$$

From the same point of view, expressions (24) and (25) in the foregoing embodiment 1 can be changed as follows.

$$\text{gate\_delay(max)} = \text{cell\_delay(max)} + \text{wire\_delay(min)} \quad (24)'$$

$$\text{gate\_delay(min)} = \text{cell\_delay(min)} + \text{wire\_delay(max)} \quad (25)'$$

This enables the verification of an increasing number of conditions, thereby being able to carry out a greater number of verifications.

What is claimed is:

1. A delay time calculation apparatus comprising:
   a placement and routing result acquiring section for obtaining a placement result of a plurality of gates of a semiconductor integrated circuit and a routing result between the plurality of gates;
   a resistance-capacitance determining section for determining, referring to the placement and routing results obtained by said placement and routing result acquiring section, a source resistance and a diffusion capacitance of a target gate of a delay time calculation before a process variation, and a wiring resistance and a wiring capacitance of a wire connected to the target gate after the process variation; and
   a delay time calculating section for calculating the delay time of the target gate according to results determined by said resistance-capacitance determining section.

2. The delay time calculation apparatus according to claim 1, wherein when determining the wiring resistance and wiring capacitance after the process variation, said resistance-capacitance determining section determines the wiring resistance and wiring capacitance for a maximum cell delay and the wiring resistance and wiring capacitance for a minimum cell delay.

3. The delay time calculation apparatus according to claim 1, wherein when determining the wiring resistance after the process variation, said resistance-capacitance determining section determines the wiring resistance considering dependence of the wiring resistance on temperature.

4. The delay time calculation apparatus according to claim 1, wherein when determining the source resistance and diffusion capacitance before the process variation, said resistance-capacitance determining section determines the source resistance and diffusion capacitance for the maximum cell delay and the source resistance and diffusion capacitance for the minimum cell delay.

5. An integrated circuit design apparatus comprising:
   a placement and routing section for placing a plurality of gates of a semiconductor integrated circuit, and for routing between the plurality of gates;
   a placement and routing result acquiring section for obtaining a placement result of the plurality of gates by said placement and routing section, and for obtaining a routing result between the plurality of gates by said placement and routing section;
   a resistance-capacitance determining section for determining, referring to the placement and routing results obtained by said placement and routing result acquiring section, a source resistance and a diffusion capacitance of a target gate of a delay time calculation before a process variation, and a wiring resistance and a wiring capacitance of a wire connected to the target gate after the process variation;
   a delay time calculating section for calculating the delay time of the target gate according to results determined by said resistance-capacitance determining section; and
   a verifying section for verifying the placement and routing results by said placement and routing section, referring to the delay time calculated by said delay time calculating section.

6. The integrated circuit design apparatus according to claim 5, wherein said verifying section provides instructions to said placement and routing section to alter at least one of the placement and routing of the gates, when the delay time said delay time calculating section calculates does not satisfy a specified condition.

* * * * *